United States Patent
Zhang et al.

(10) Patent No.: US 10,181,504 B2
(45) Date of Patent: Jan. 15, 2019

(54) FLEXIBLE DISPLAY PANEL WITH REDUNDANT BENT SIGNAL LINES

(71) Applicant: Apple Inc., Cupertino, CA (US)

(72) Inventors: Zhen Zhang, San Jose, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 205 days.

(21) Appl. No.: 15/148,929

(22) Filed: May 6, 2016

(65) Prior Publication Data

US 2017/0110529 A1    Apr. 20, 2017

Related U.S. Application Data

(60) Provisional application No. 62/241,342, filed on Oct. 14, 2015.

(51) Int. Cl.
| H01L 27/32 | (2006.01) |
| H01L 51/52 | (2006.01) |
| H01L 51/00 | (2006.01) |

(52) U.S. Cl.
CPC ...... *H01L 27/3276* (2013.01); *H01L 51/0097* (2013.01); *H01L 51/5253* (2013.01); *H01L 2251/5338* (2013.01); *Y02E 10/549* (2013.01)

(58) Field of Classification Search
CPC ............. H01L 27/1225; H01L 27/1255; H01L 29/78648; H01L 29/78678; G02F 1/136227; G02F 2202/42; G02F 2001/13685; G02F 2001/13606; G02F 1/133345; G02F 2201/40
See application file for complete search history.

(56) References Cited

U.S. PATENT DOCUMENTS

| 2012/0206402 | A1 | 8/2012 | Park et al. |
| 2013/0037792 | A1* | 2/2013 | Kim .................... H01L 51/5256 257/40 |
| 2014/0176886 | A1* | 6/2014 | Yoshida ............... G02F 1/1339 349/110 |
| 2014/0231763 | A1* | 8/2014 | Kim .................... H01L 27/3218 257/40 |
| 2014/0254111 | A1* | 9/2014 | Yamazaki .......... H01L 51/0097 361/749 |
| 2015/0382446 | A1 | 12/2015 | Kwon et al. |
| 2016/0035759 | A1 | 2/2016 | Kwon et al. |
| 2016/0035812 | A1 | 2/2016 | Kwon et al. |
| 2016/0064466 | A1* | 3/2016 | Son .................... H01L 27/3276 257/40 |

(Continued)

*Primary Examiner* — Mohammed R Alam
(74) *Attorney, Agent, or Firm* — Treyz Law Group, P.C.; G. Victor Treyz; David K. Cole

(57) ABSTRACT

A display may have an array of organic light-emitting diodes that form an active area on a flexible substrate. Metal traces may extend between the active area and an inactive area of the flexible substrate. Display driver circuitry such as a display driver integrated circuit may be coupled to the inactive area. The metal traces may extend across a bent region in the flexible substrate. A coating layer in the bent region may serve as a neutral stress plane adjustment layer. Metal traces may have meandering shapes such as zigzag shapes to reduce stress when bending. Adjacent traces may be shorted together to provide redundancy. Multiple layers of traces may be provided. Inorganic passivation layer coatings on the metal traces may help protect the metal traces.

17 Claims, 12 Drawing Sheets

(56) References Cited

U.S. PATENT DOCUMENTS

2016/0066408 A1  3/2016  Drzaic et al.
2016/0105950 A1  4/2016  Afentakis
2016/0190158 A1* 6/2016  Song .................. G02F 1/13452
                                          257/773

* cited by examiner

FLEXIBLE DISPLAY PANEL WITH REDUNDANT BENT SIGNAL LINES

This application claims the benefit of provisional patent application No. 62/241,342 filed on Oct. 14, 2015, which is hereby incorporated by reference herein in its entirety.

BACKGROUND

This relates generally to electronic devices with displays, and, more particularly, to displays with bent portions.

Electronic devices often include displays. Displays such as organic light-emitting diode displays may be formed on flexible substrates. Displays with flexible substrates may be bent. For example, it may be desirable to bend an edge of a display to hide inactive display components along the edge of the display from view.

The process of bending a display can create stresses within the structures of the display. For example, bent metal traces may become stressed. Stress-induced damage such as cracks may adversely affect display reliability.

It would therefore be desirable to be able to provide improved displays with bent portions.

SUMMARY

A display may have an array of pixels. The pixels may contain light-emitting diodes such as organic light-emitting diodes and may form an active area that displays images.

The pixels may be formed from thin-film layers on a flexible substrate. Conductive traces such as metal traces may extend between the active area and an inactive area of the flexible substrate. Display driver circuitry such as a display driver integrated circuit may be coupled to contacts formed from the metal traces in the inactive area.

The metal traces may extend across a bent portion of the flexible substrate. A coating layer in this region may serve as a neutral stress plane adjustment layer that help align a neutral stress plane in the bent portion with the metal traces.

To help enhance reliability for the metal traces, the metal traces may have meandering shapes such as zigzag shapes. Adjacent traces may be shorted together to provide redundancy. For example, each pair of adjacent traces may be shorted together by a series of redundant paths that bridge the gap between the adjacent traces.

Multiple layers of traces may be provided. For example, a first metal layer may be patterned to form a first set of zigzag lines and a second metal layer may be patterned to form a second set of zigzag lines. The lines in the first and second sets may be laterally offset with respect to each other to help reduce overlap and thereby prevent crosstalk. Inorganic passivation layer coatings on the metal traces may help protect the metal traces. The metal traces may be formed on buffer layers on the flexible substrate.

Further features will be more apparent from the accompanying drawings and the following detailed description.

DETAILED DESCRIPTION

Figure 1:
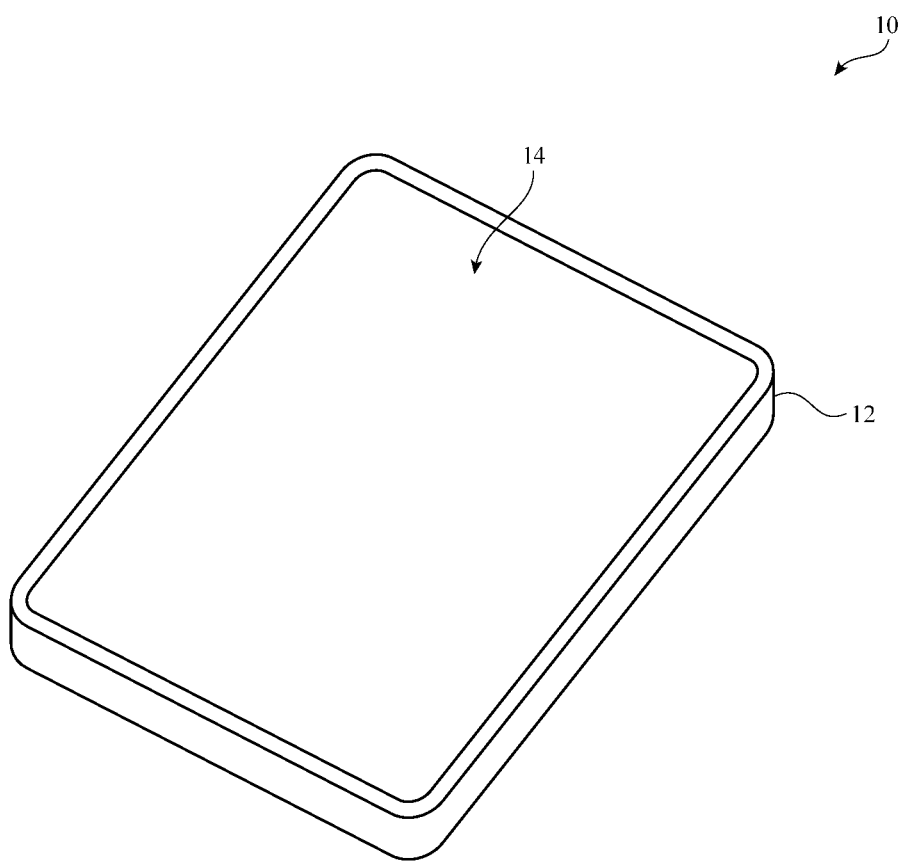
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, a watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. The array of pixels may display images for a user in active area of display 14. The active area may be surrounded on one or more sides by inactive border regions.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
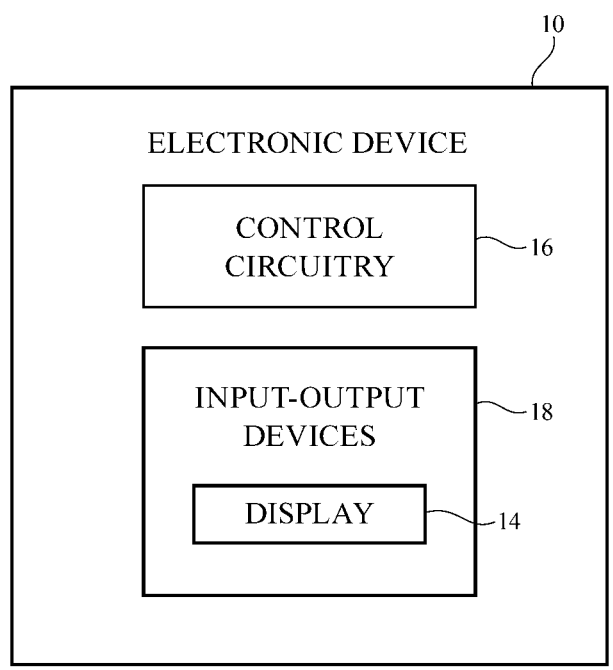
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint), may be circular or oval, may have a shape with both straight and curved edges, or may have other suitable shapes. Display 14 may be planar or may have a curved profile.

Figure 3:
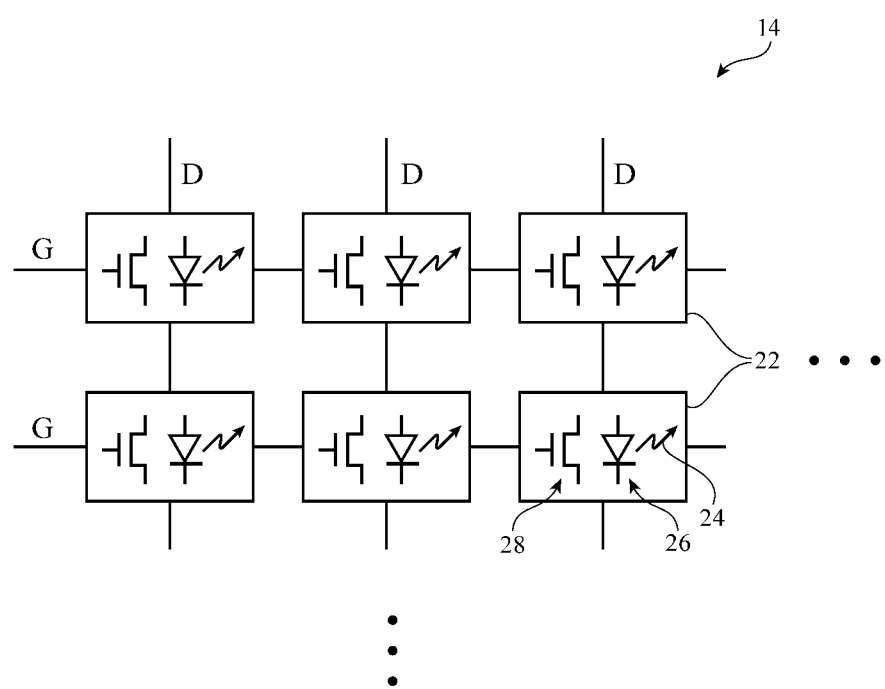
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors.

Figure 4:
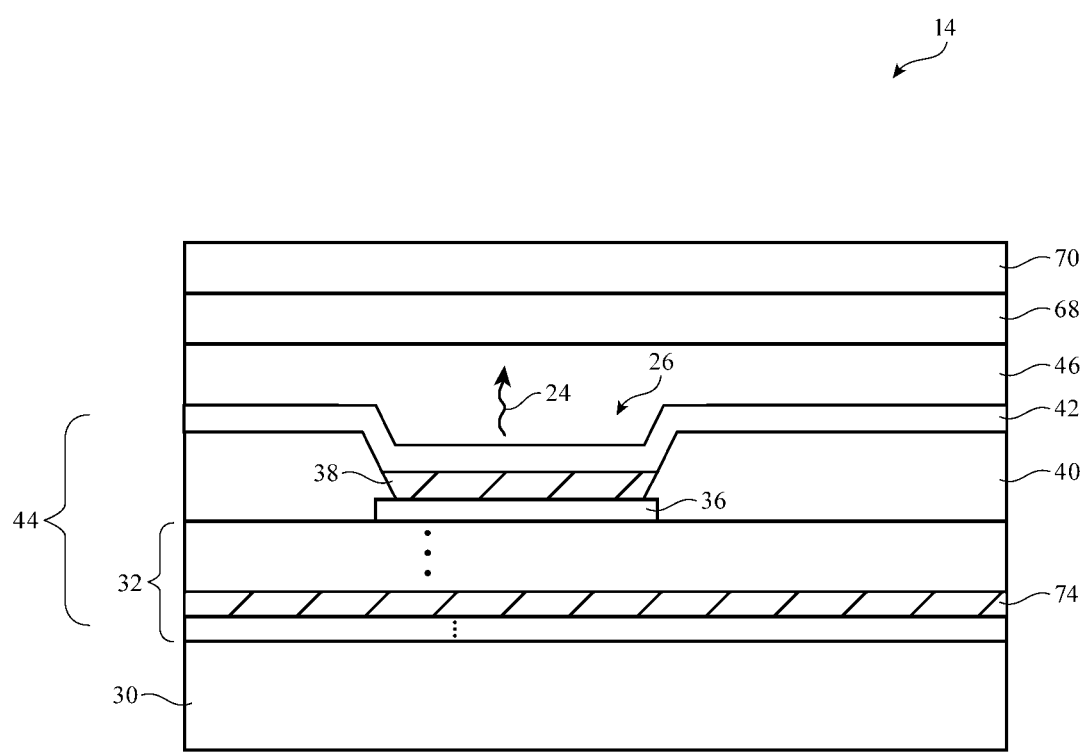
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from plastic or other suitable materials. One or more sublayers of material may form substrate 30. Configurations for display 14 in which substrate 30 has been formed from a flexible material such as polyimide, acrylic, or other flexible polymer are sometimes described herein as an example.

Thin-film transistor circuitry 44 may be formed on substrate 30. Thin film transistor circuitry 44 may include layers 32. Layers 32 may include inorganic layers such as inorganic buffer layers, gate insulator, passivation, interlayer dielectric, and other inorganic dielectric layers. Layers 32 may also include organic dielectric layers such as a polymer layers. Polymer layers may be used, for example, as planarization layers, as interlayer dielectric, and as neutral stress plane adjustment layers (as examples). Metal layers and semiconductor layers may also be included within layers 32. For example, semiconductors such as silicon, semiconducting-oxide semiconductors such as indium gallium zinc oxide, or other semiconductor materials may be used in forming semiconductor channel regions for thin-film transistors 28. Metal in layers 32 may be used in forming transistor gate terminals, transistor source-drain terminals, capacitor electrodes, and metal interconnects. If desired, conductive polymers, conductive nanostructures, and other conductive materials may be included in display 14 (e.g., to form signal traces in a bent portion of display 14).

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 40. Pixel definition layer 40 may be formed from a patterned photoimageable polymer such as polyimide. In each light-emitting diode, organic emissive material 38 is interposed between a respective anode 36 and cathode 42. Anodes 36 may be patterned from a layer of metal. Cathode 42 may be formed from a common conductive layer that is deposited on top of pixel definition layer 40 (e.g., a thin layer of metal such as a layer of AgMg). Cathode 42 is transparent so that light 24 may exit light emitting diode 26. During operation, light-emitting diode 26 may emit light 24.

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74. Portions of metal traces 74 and other conductive traces may extend from pixels 22 to inactive areas of display 14.

If desired, display 14 may have a protective outer display layer such as cover glass layer 70. The outer display layer may be formed from a material such as sapphire, glass, plastic, clear ceramic, or other transparent material. Protective layer 46 may cover cathode 42. Layer 46 may include adhesive, moisture barrier structures and other encapsulation structures, and/or other materials to help protect thin-film transistor circuitry 44. Functional layers 68 may be interposed between layer 46 and cover layer 70. Functional layers 68 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30. If desired, touch sensor structures for display 14 may be formed from metal layers in thin-film transistor circuitry 44 rather than using a separate touch sensor panel in layer 68.

Display 14 may have an active area in which pixels 22 form images for viewing by a user of device 10. The active area may have a rectangular shape or other suitable shape. Inactive portions of display 14 may surround the active area. For example, signal traces and other support circuitry such as thin-film display driver circuitry may be formed along one or more of the four edges that run around the rectangular periphery of a rectangular display or may be formed along other peripheral portions of display 14 adjacent to the active area. If desired, one or more display driver integrated circuits may be mounted to substrate 30 in the inactive border (e.g., integrated circuit pads on one or more display driver integrated circuits may be coupled to corresponding contact pads formed at the ends of the signal paths on substrate 30 in the inactive border). This allows the display driver circuitry to supply signals to the data and gate lines on display 14. If desired, a flexible printed circuit on which one or more display driver integrated circuits have been mounted using solder may be attached to contact pads formed from the end portions of the signal lines in the border of display 14.

To minimize the amount of the inactive border area of display 14 that is visible to a user, one or more edges of display 14 may be bent. As an example, the edge of display 14 to which a display driver circuit or flexible printed circuit has been attached may be folded under the active area of display 14. This helps minimize visible display borders and reduces the footprint of display 14.

Figure 5:
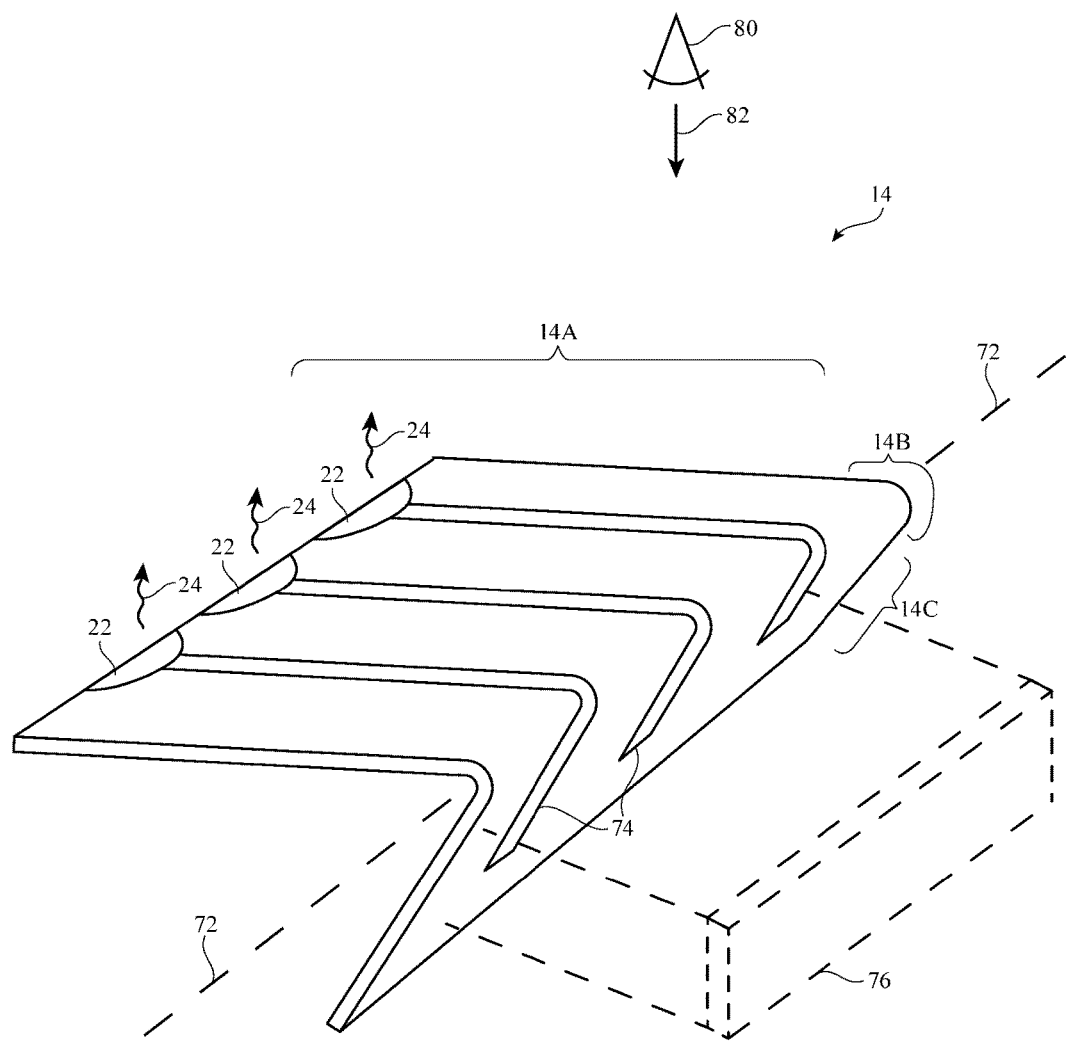
FIG. 5 is perspective view of an illustrative display with a bent portion in accordance with an embodiment.

An illustrative display with a bent edge portion is shown in FIG. 5. As shown in FIG. 5, display 14 has portion 14A (i.e., a planar active area portion that contains the active area of display 14 that is formed by an array of pixels 22), bent portion 14B, and inactive portion 14C. If desired, connectors, display driver integrated circuits or other integrated circuits, flexible printed circuits, and/or other components 76 may be mounted to inactive portion 14C of display 14.

Conductive traces such as metal traces 74 may carry signals between inactive area 14C of display 14 and active area 14A of display 14 (i.e., metal traces 74 may traverse bent portion 14B of display 14). When bent portion 14B is bent around bend axis 72, portion 14C may be folded partly or completely under portion 14A and may therefore be hidden from view by a user such as viewer 80 who is viewing display 14 in direction 82. As shown in FIG. 5, component(s) 76 (e.g., display driver circuitry, etc.) may be mounted on the upper and/or lower surface of display 14 in region 14C. An optional support structure such as a mandrel with a curved surface may be used to support display 14 in bend region 14B (e.g., to help establish a desired minimum bend radius in region 14B) or the mandrel may be omitted to help minimize display thickness (e.g., by allowing portions 14A and 14C to be mounted more closely together and by allowing the bend radius for region 14B to be reduced).

When bending display 14 in region 14B, care should be taken to ensure that sensitive display structures do not become damaged. Stresses can be imparted to display structures in a flexible display when the display is bent. For example, conductive traces such as metal traces 74 of FIG. 5 that are used to form signal lines that convey signals between display driver circuitry or other circuits in inactive region 14C and pixels 22 in region 14A may be subjected to bending stresses in bend region 14B. To minimize bending stress and thereby minimize cracks in traces 74, it may be desirable to align the neutral stress plane of display 14 in bend region 14B with traces 74.

Figure 6:
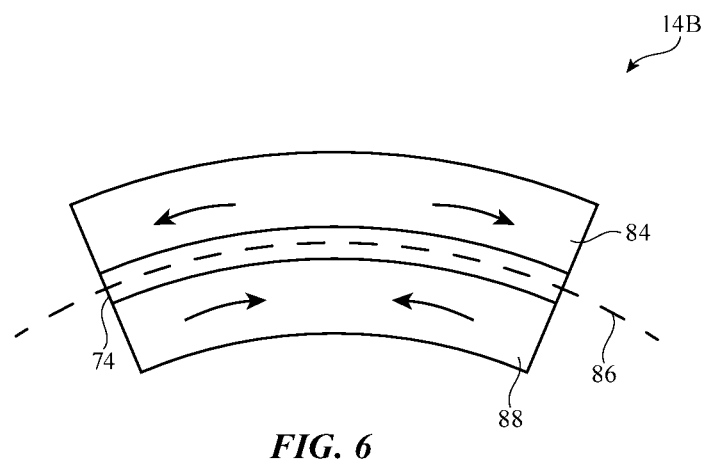
FIG. 6 is a cross-sectional side view of an illustrative bent substrate showing how a neutral stress plane may be aligned with a layer of signal lines using a coating layer in accordance with an embodiment.

As shown in FIG. 6, when a portion of display 14 is bent in region 14B, some layers such as layer(s) 88 (e.g., a portion of display 14 that includes substrate 30) may be subjected to compressive stress and some layers such as layer(s) 84 (e.g., a coating layer and other layers above the substrate) may be subjected to tensile stress. Neutral stress plane 86 arises where stress has been eliminated by balancing the compressive stress and tensile stress. The shape of neutral stress plane 86 may be curved in a curved portion of display 14 such as portion 14B of FIG. 7 (i.e., neutral stress plane 86 may have a curved profile).

The relative thicknesses of layers 88 and 84 and the relative modulus of elasticity values for layers 88 and 84 determine the location of the neutral stress plane within the layers of bent display region 14B. For example, if the elasticity of layer 88 and layer 84 is the same, neutral stress plane 86 can be aligned with metal traces 74 between layers 88 and 84 by ensuring that layer 84 has the same thickness as layer 88. If, on the other hand, layer 84 has an elasticity that is larger than that of layer 88, layer 84 need not be as thick as layer 88 to balance the compressive and tensile stresses in this way.

To help prevent damage to the signal lines in bend region 14B, the signal paths of display 14 may be provided with redundancy. For example, pairs of adjacent lines may be shorted together using periodic redundancy connections. Meandering path shapes such as zigzag shapes and serpentine shapes may also be used for the portions of the signal lines traversing region 14B. Particularly in high-resolution displays, there may be a relatively large number of signal lines passing through region 14B (e.g., hundreds or thousands or more). To ensure that a sufficient number of signal paths can be provided, it may be desirable to form signal lines from multiple layers of metal. Interlayer dielectric may be used in isolating the signal lines in different layers from each other. Capacitive coupling between the signal lines of different layers may be reduced by shifting layers of lines horizontally with respect to each other. This creates a configuration for display 14 in which successive metal layers have staggered metal lines. Corrosion and other types of damage to the bent signal lines in region 14B may also be reduced by passivating the surfaces of the lines using a dielectric coating.

Figure 7:
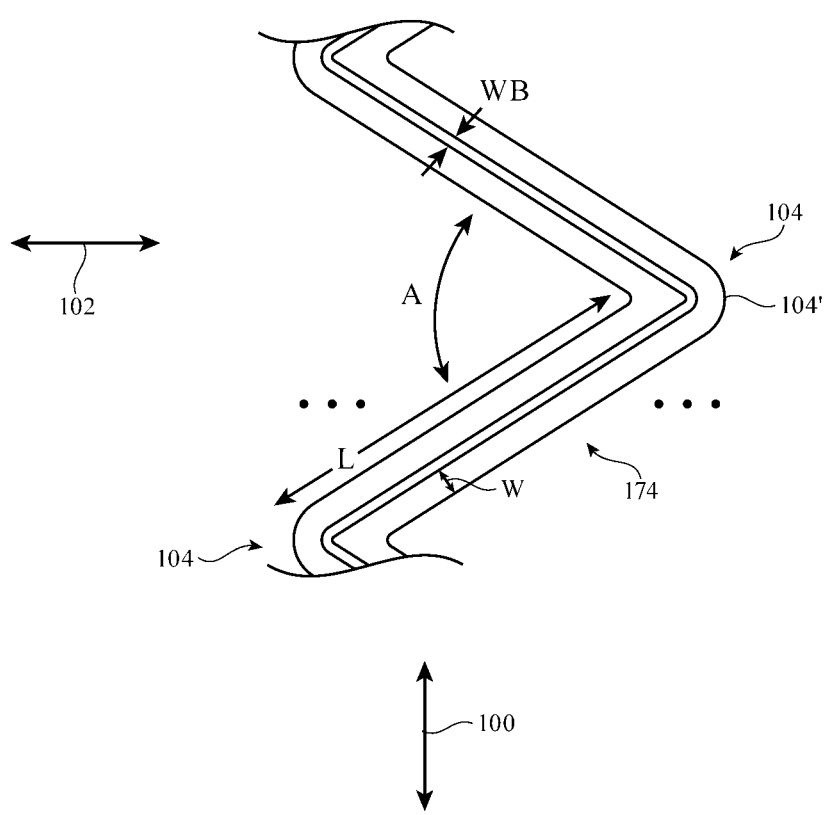
FIG. 7 is a top view of a portion of a display showing how zigzag signal lines may be used to help accommodate display bending in accordance with an embodiment.

A top view of illustrative meandering signal lines of the type that may be used for bent portion 14B of display 14 is shown in FIG. 7. There may be any suitable number of lines 174 (e.g., tens, hundreds, or thousands of lines). Signal lines 174 may be formed from metal traces 74 in layers 32 and/or other conductive traces. Lines (traces) 174 may run parallel to axis 100 (i.e., axis 100 may be parallel to the longitudinal axes of lines 174). Bend axis 72 (FIG. 5) may extend perpendicular to lines 174 (i.e., bend axis 72 may run parallel to axis 102).

Lines 174 may have a width W of about 2.5 microns (e.g., more than 1 micron, more than 2 microns, 2-10 microns, less than 10 microns, less than 5 microns, 5-30 microns, 10-75 microns, less than 50 microns, or other suitable width). The separation WB between adjacent lines 174 may be more than 1 micron, more than 2 microns, 2-10 microns, less than 10 microns, less than 5 microns, 5-30 microns, 10-75 microns, less than 50 microns, or other suitable distance. The length L of each segment of line 174 between successive line bends 104 may be about 50-250 microns, more than 40 microns, less than 300 microns, 10-100 microns, less than 25 microns, more than 20 microns, or other suitable length. The thickness of each line may be less than 1 micron, less than 0.5 microns, 0.1 to 0.3 microns, more than 0.01 micron, more than 0.1 microns, 0.05 to 0.5 microns, or other suitable thickness. Corners 104 of lines 174 may be curved to help reduce stress concentration. Curved corners may be produced using curved photolithographic masks and/or using semiconductor fabrication techniques (e.g., wet or dry etching techniques or other patterning techniques) that help create curved edges at bends in lines 174. As an example, corner edges 104' of lines 174 may have a bending radius of 0.2 mm, 0.1 to 0.3 mm, more than 0.05 mm, less than 0.5 mm, or other suitable bend radius. The separation angle A between successive segments of lines 174 between the bends at corners 104 may be about 120° (i.e., the tilt angle of each segment of line 174 with respect to axis 100 may be about) 60°. Axis 100 runs parallel to the longitudinal axis of zigzagging line 174 (vertically in the orientation of FIG. 7) and crosses bend axis 72 at a right angle. If desired, the value of A may be less than 120° (e.g., 0-120°) or may be more than 120° (e.g., 120° to 180°). The use of a value for A of 120° is merely illustrative.

Figure 8:
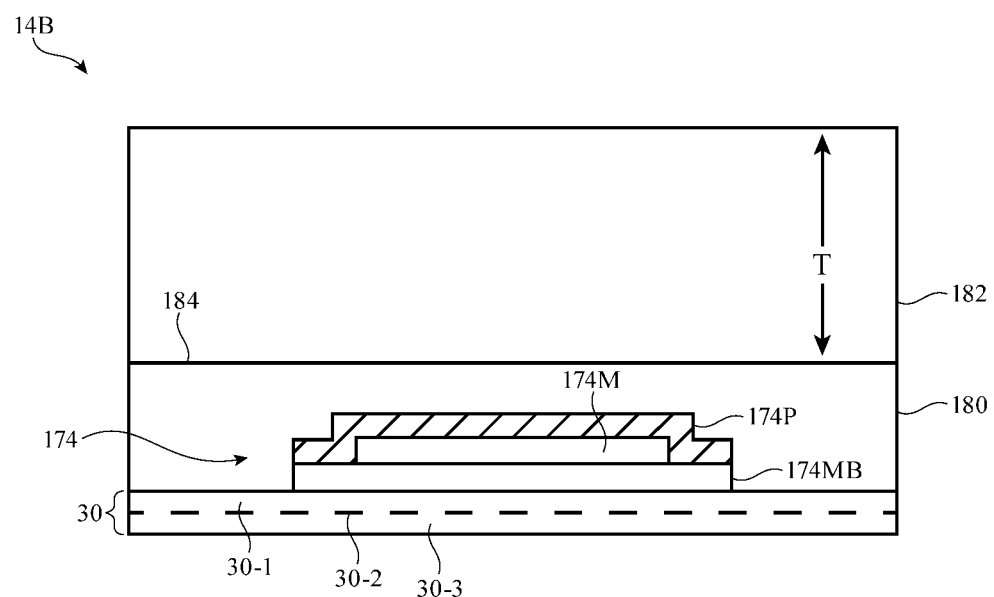
FIG. 8 is a cross-sectional side view of a portion of a display having a signal line in accordance with an embodiment.

FIG. 8 is a cross-sectional side view of a portion of display 14 containing an illustrative signal line such as line 174 of FIG. 7. As shown in FIG. 8, bend region (bent region) 14B of display 14 may include substrate 30. Substrate 30 may include one or more layers of material and may be flexible. With one illustrative configuration, substrate 30 may include upper and lower layers 30-1 and 30-3 formed from a flexible polymer such as polyimide and an interposed barrier layer 30-2. Barrier layer 30-2 may be formed from one or more layers of inorganic material such as silicon oxide and may help block moisture. The thickness of substrate 30 may be 3-20 microns, less than 20 microns, less than 8 microns, less than 7 microns, less than 6 microns, or other suitable thickness.

Line 174 may be formed using a strip of buffer layer material such as buffer layer 174MB. Layer 174MB, which may sometimes be referred to as a multilayer buffer, may be interposed between substrate 30 and conductive layer 174M. Layer (trace) 174M may be formed from metal or other conductive material. Layer 174MB may help prevent moisture from reaching metal layer 174M. Layer 174MB may include one or more layers of material such as alternating layers of inorganic material (e.g., silicon oxide alternated with silicon nitride), other inorganic layer(s) and/or organic layer(s).

Layer 174 may be formed form a metal such as aluminum, molybdenum, titanium, copper, silver, gold, other metals, metal alloys, and/or multiple sublayers formed from these metals or other suitable metals. Layer 174 may also be formed from conductive polymers such as poly(3,4-ethylenedioxythiophene) polystyrene sulfonate, conductive nanostructures (e.g., silver nanowires, carbon nanotubes, etc.), and other conductive materials (e.g., carbon inks, etc.). Configurations in which conductive traces for display 14 are formed from metal may sometimes be described herein as an example. This is, however, merely illustrative. Any suitable conductive material may be used in forming the signal lines that traverse bend region 14B of display 14.

Dielectric passivation layer 174P may be formed on top of layer 174M. Portions of passivation layer 174P may extend down the sides of layer 174M and may contact buffer layer 174MB. In this way, the metal line formed from layer 174M may be surrounded by dielectric material that helps prevent moisture from reaching the metal line, thereby helping to avoid corrosion. Passivation layer 174P may be formed from one or more inorganic layers (e.g., silicon oxide, silicon nitride, silicon oxynitride, etc.) and/or one or more polymer layers.

Polymer planarization layer 180 may cover line 174 and may have a planar upper surface (surface 184). If desired, one or more additional layers of signal lines such as lines 174 may be formed above the first layer of lines that is shown in FIG. 8. A coating layer such as layer 182, which may be formed from an organic material such as polyimide or other polymer, may cover layer 180 and any layers formed above layer 180. Layer 182, which may sometimes be referred to as a neutral stress plane adjustment layer, may have a modulus and thickness T that place neutral stress plane 86 (FIG. 6) in a desired location. Layer 182 may, for example, be configured to align neutral stress plane 86 with signal lines 174 in region 14B to help reduce stress in region 14B.

Signal paths in region 14B may be provided with redundancy by shorting together adjacent lines. Two thin lines that are shorted together may exhibit better immunity to stress-induced damage than one thicker line with a width equal to the widths of the two thin lines added together. As a result, arrangements in which two or more parallel signal lines are shorted together may help ensure that the signal paths in region 14B operate satisfactorily, even when display 14 is bent tightly in region 14B.

Figure 9:
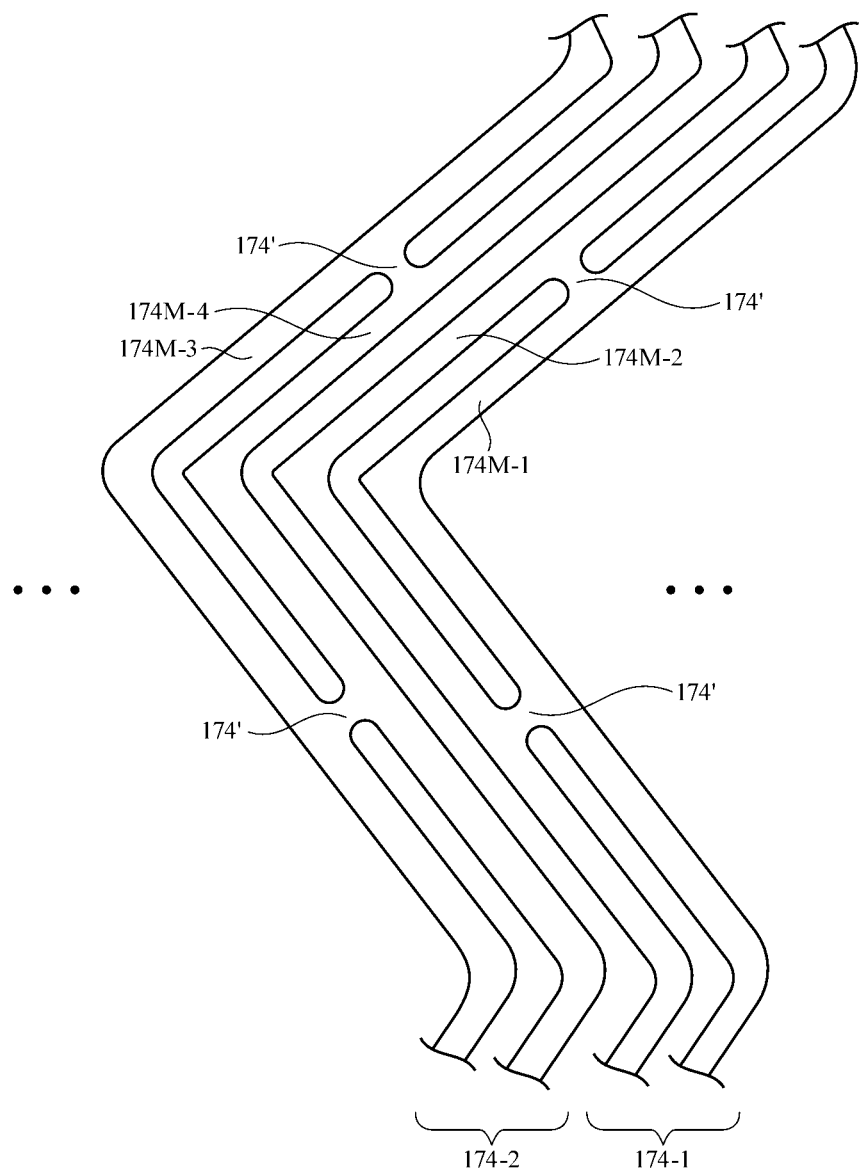
FIGS. 9 and 10 are top views of illustrative zigzag signal paths with redundancy in accordance with an embodiment.

An illustrative configuration for display 14 with zigzag traces in region 14B that include redundancy structures is shown in FIG. 9. In the example of FIG. 9, signal path 174-1 is formed from parallel adjacent metal lines 174M-1 and 174M-2, which are shorted together with redundancy paths 174' and signal path 174-2 is formed from parallel adjacent metal lines 174M-3 and 174M-4, which are shorted together with redundancy paths 174'. Redundancy paths (segments) 174' bridge the gaps separating the adjacent lines. Each of paths 174-1 and 174-2 contains a pair of adjacent lines. If desired, three or more adjacent lines may be shorted together to provide additional redundancy.

Figure 10:
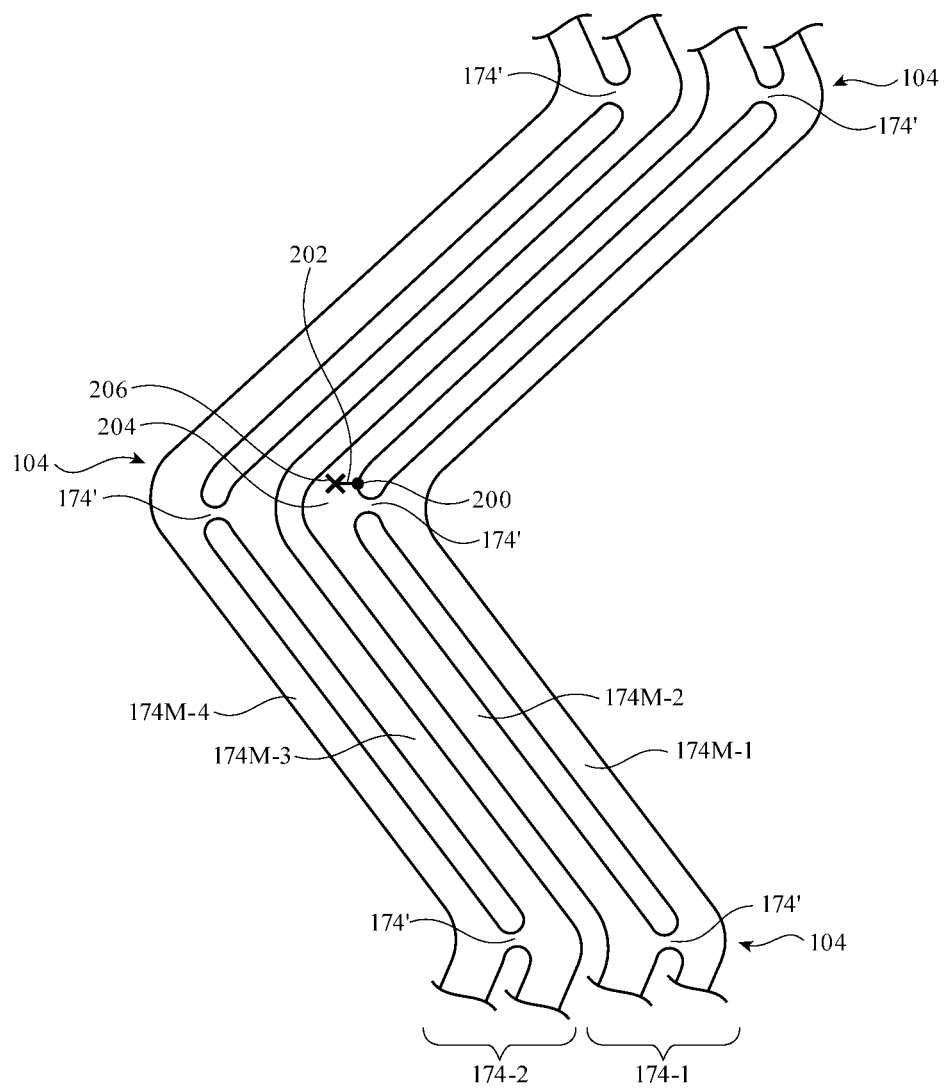

In the example of FIG. 9, redundancy paths 174' are located in the middle of the zigzagging segments of each line. If desired, redundancy paths 174' may be formed at different locations along the lengths of lines 174. In the configuration of FIG. 10, for example, redundancy paths 174' are located at zigzag trace corners 104.

As shown in FIG. 10, there is a potential for cracks such crack 202 to develop in bent metal traces. With configurations of the type shown in FIGS. 9 and 10, cracks tend to terminate in low stress portions of lines 174. As an example, crack 202 may originate at a sharp bend in the metal traces (e.g., location 200), which may exhibit more internal stress than other portions of lines 174. As crack 202 propagates, however, crack 202 will tend to reach an area of lines 174 that exhibits low stress such as region 204. The low stress level in region 204 can help terminate further propagation of crack 202. For example, crack 202 may terminate at low stress level termination point 206.

Figure 11:
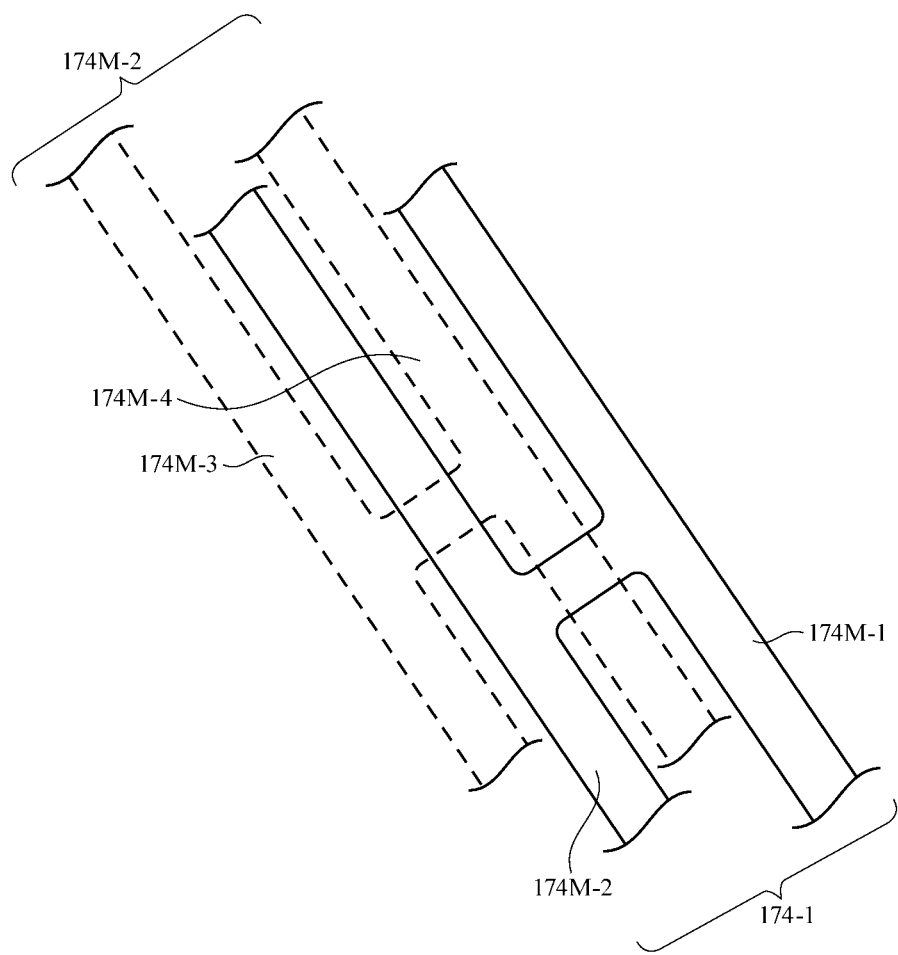
FIG. 11 is a top view of a set of staggered zigzag traces in respective layers of a display in accordance with an embodiment.

If desired, signal line density in region 14B may be increased by forming multiple layers of signal lines in region 14B. A top view of a portion of region 14B that contains two layers of signal lines is shown in FIG. 11. In the example of FIG. 11, signal line 174-1 has been formed from a patterned first layer of metal and includes redundant parallel lines 174M-1 and 174M-2. Signal line 174-2 is formed from a patterned second layer of metal and includes redundant parallel metal lines 174M-3 and 174M-4. As illustrated by lines 174-1 and lines 174-2 in FIG. 11, the lines in different metal layers may be laterally offset (staggered) with respect to each other. This reduces overlap between the lines in different layers and thereby reduces capacitive coupling between the lines in different layers that could lead to signal crosstalk.

Figure 12:
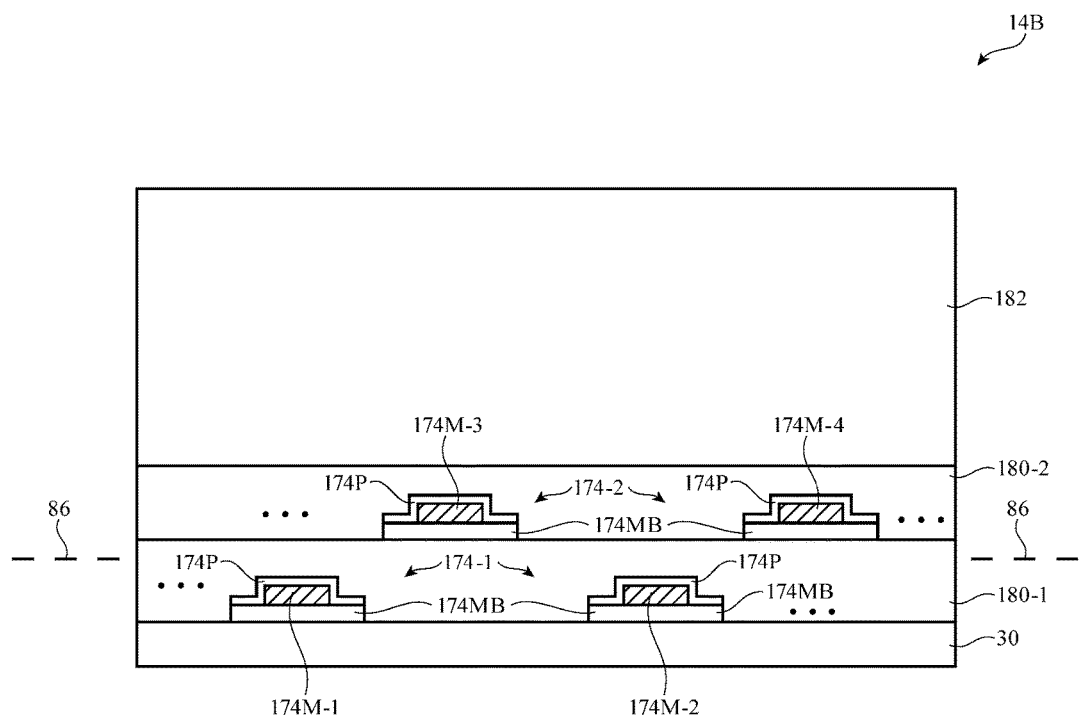
FIG. 12 is a cross-sectional side view of the layered staggered zigzag traces of FIG. 11 in accordance with an embodiment.

Dielectric may be interposed between the lines in different layers to isolate these lines from each other. A cross-sectional side view of a bent portion of display 14 in which multiple layers of signal lines have been formed is shown in FIG. 12. In the example of FIG. 12, a first layer of signal lines (lines 174-1) has been formed using a first layer of patterned metal (i.e., metal traces 174M-1 and 174M-2, which may be shorted together using redundancy paths 174'). Planarization layer 180-1 may cover lines 174-1. A second layer of signal lines (lines 174-2) may be formed on the upper surface of planarization layer 180-1. The second layer of signal lines may be formed using a second layer of patterned metal (i.e., metal traces 174M-3 and 174M-4, which may be shorted together using redundancy paths 174'). Planarization layer 180-2 may cover the second layer of lines (e.g., lines 174-2).

Neutral stress plane adjustment layer 182 may be formed on layer 180-2 and may have a thickness suitable for positioning the neutral stress plane of region 14B in alignment with lines 174-1 and/or lines 174-2 (see, e.g., illustrative neutral stress plane 86). Layers 180-1 and 180-2 may be formed from organic layers (e.g., polymer layers). If desired, layer 180-2 may be omitted and layer 182 may be formed directly on the surface of layer 180-1. The configuration of FIG. 12 is merely illustrative. Metal traces 174M-1, 174M-2, 174M-3, and 174M-4 may be formed on buffer lines formed from buffer layer material (layers 174MB) and may be coated using passivation layers 174P.

The foregoing is merely illustrative and various modifications can be made by those skilled in the art without departing from the scope and spirit of the described embodiments. The foregoing embodiments may be implemented individually or in any combination.

What is claimed is:

1. A display, comprising: a flexible substrate; an array of pixels that form an active area on the flexible substrate; and zigzag metal traces that extend from the active area to an inactive area on the flexible substrate across a bent region on the flexible substrate, wherein the zigzag metal traces include stacked first and second layers of zigzag metal traces that are separated by a dielectric layer across the bent region, wherein the zigzag metal traces in the first layer of zigzag metal traces are staggered with respect to the zigzag metal traces in the second layer of zigzag metal traces across the bent region to reduce capacitive coupling between the zigzag metal traces of the first and second layers.

2. The display defined in claim 1 wherein the zigzag metal traces further comprise redundancy paths that short adjacent traces in the first layer of zigzag metal traces together and that short adjacent traces in the second layer of zigzag metal traces together.

3. The display defined in claim 2 further comprising a first inorganic passivation layer coating on the first layer of zigzag metal traces and a second inorganic passivation layer coating on the second layer of zigzag metal traces.

4. The display defined in claim 3 wherein the first and second inorganic passivation layers include oxide.

5. The display defined in claim 4 further comprising a first buffer layer under the first layer of zigzag metal traces and a second buffer layer under the second layer of zigzag metal traces.

6. The display defined in claim 5 wherein the first buffer layer is formed on the flexible substrate.

7. The display defined in claim 6 wherein the dielectric that separates the first and second layers of zigzag metal traces comprises a planarization layer that covers the first layer of zigzag metal traces.

8. The display defined in claim 7 wherein the second buffer layer is formed on the planarization layer.

9. The display defined in claim 8 further comprising a polymer coating layer that overlaps the second layer of zigzag metal traces and that serves as a neutral stress plane adjustment layer.

10. The display defined in claim 9 further comprising an additional planarization layer that covers the second layer of zigzag metal traces and that is interposed between the polymer coating layer and the planarization layer.

11. The display defined in claim 10 wherein the planarization layer and the additional planarization layer comprise polymer layers.

12. The display defined in claim 11 wherein the zigzag metal traces have corners and wherein the redundancy paths each short a pair of the zigzag metal traces together at the corners.

13. The display defined in claim 12 wherein the zigzag metal traces have segments coupled between successive corners and wherein the redundancy paths are each located along one of the segments and short a pair of the zigzag metal traces together.

14. A display, comprising: a flexible substrate; an array of pixels that form an active area on the flexible substrate; conductive traces that extend from the active area to an inactive area on the flexible substrate across a bent region on the flexible substrate, wherein the conductive traces are first zigzag traces; a continuous inorganic passivation layer covering the conductive traces across the bent region in the inactive area; an organic layer covering the inorganic passivation layer across the bent region in the inactive area, wherein the organic layer comprises a polymer planarization layer; and second zigzag traces on the polymer planarization layer, wherein the polymer planarization layer is interposed between the first zigzag traces and the second zigzag traces, and wherein the polymer planarization layer electrically isolates the first zigzag traces from the second zigzag traces.

15. The display defined in claim 14 wherein the conductive traces include pairs of adjacent conductive traces and wherein each pair of adjacent conductive traces includes first and second adjacent conductive traces that are shorted together with redundancy paths.

16. The display defined in claim 15 further comprising a buffer layer interposed between the conductive traces and the flexible substrate.

17. A display, comprising: a flexible substrate; an array of pixels, wherein the array of pixels comprises organic light-emitting diode pixels; first and second layers of zigzag conductive traces that extend from the array of pixels to an inactive peripheral area on the flexible substrate across a bent region of the flexible substrate, wherein the first and second layers of zigzag conductive traces comprise first and second metal zigzag traces; first layer redundancy paths that short at least some of the first zigzag conductive traces to each other; second layer redundancy paths that short at least some of the second zigzag conductive traces to each other; a first inorganic passivation layer that completely covers the first layer of zigzag conductive traces; a second inorganic passivation layer that covers the second layer of zigzag conductive traces; and a polymer layer interposed between the first and second layers of zigzag conductive traces.

* * * * *